United States Patent
Duchene et al.

(10) Patent No.: US 8,471,571 B2
(45) Date of Patent: Jun. 25, 2013

(54) METHOD FOR SELECTING AN ITEM OF EQUIPMENT AND CONTROL UNIT ENABLING THIS METHOD TO BE IMPLEMENTED

(75) Inventors: Isabelle Duchene, Marignier (FR); Jérôme Mathieu, Bonneville (FR)

(73) Assignee: Somfy SAS, Cluses (FR)

( * ) Notice: Subject to any disclaimer, the term of this patent is extended or adjusted under 35 U.S.C. 154(b) by 241 days.

(21) Appl. No.: 12/458,248

(22) Filed: Jul. 6, 2009

(65) Prior Publication Data
US 2010/0001746 A1 Jan. 7, 2010

(30) Foreign Application Priority Data
Jul. 3, 2008 (FR) ...................................... 08 54535

(51) Int. Cl.
*G01R 27/26* (2006.01)
(52) U.S. Cl.
USPC ........................................................... 324/676
(58) Field of Classification Search
USPC ........................................................... 324/676
See application file for complete search history.

(56) References Cited

U.S. PATENT DOCUMENTS

| | | | | |
|---|---|---|---|---|
| 6,504,530 B1 * | 1/2003 | Wilson et al. | ................. | 345/173 |
| 7,777,502 B2 * | 8/2010 | Grosser et al. | ................. | 324/686 |
| 2002/0024332 A1 * | 2/2002 | Gardner | ..................... | 324/103 R |
| 2002/0130847 A1 * | 9/2002 | Conzola et al. | ............... | 345/173 |
| 2003/0172283 A1 * | 9/2003 | O'Hara | ......................... | 713/186 |
| 2004/0260407 A1 * | 12/2004 | Wimsatt | ......................... | 700/19 |
| 2004/0260427 A1 * | 12/2004 | Wimsatt | ......................... | 700/275 |
| 2005/0078027 A1 | 4/2005 | Philipp | | |
| 2006/0101338 A1 * | 5/2006 | Kates | ............................ | 715/716 |
| 2006/0158446 A1 * | 7/2006 | Gong et al. | ................... | 345/211 |
| 2006/0177212 A1 | 8/2006 | Lamborghini | | |
| 2006/0238385 A1 * | 10/2006 | Steenwyk et al. | .............. | 341/33 |
| 2006/0256089 A1 | 11/2006 | Atanassov | | |
| 2007/0120828 A1 * | 5/2007 | Fyke | ............................. | 345/169 |
| 2007/0260713 A1 * | 11/2007 | Moorer et al. | ................. | 709/220 |
| 2007/0288849 A1 * | 12/2007 | Moorer et al. | ................. | 715/736 |
| 2008/0211779 A1 * | 9/2008 | Pryor | ............................ | 345/173 |
| 2008/0313566 A1 * | 12/2008 | Barnum et al. | ............... | 715/825 |
| 2010/0176823 A1 * | 7/2010 | Thompson et al. | ........... | 324/676 |

FOREIGN PATENT DOCUMENTS

| | | |
|---|---|---|
| DE | 10110759 | 3/2000 |
| EP | 1859992 | 11/2007 |
| FR | 2811162 | 6/2000 |

* cited by examiner

*Primary Examiner* — Tung X Nguyen
(74) *Attorney, Agent, or Firm* — Dowell & Dowell, PC

(57) ABSTRACT

Home electronic automation equipment to be controlled is selected from among several predefined groups of equipment, via capacitive sensors which are disposed next to one another on a control unit. A predefined group of equipment is selected by activating individual capacitive sensors. At least one additional group of equipment is selected via a predetermined sequence for activating several of the same capacitive sensors, of which at least two capacitive sensors are non-adjacent sensors.

16 Claims, 4 Drawing Sheets

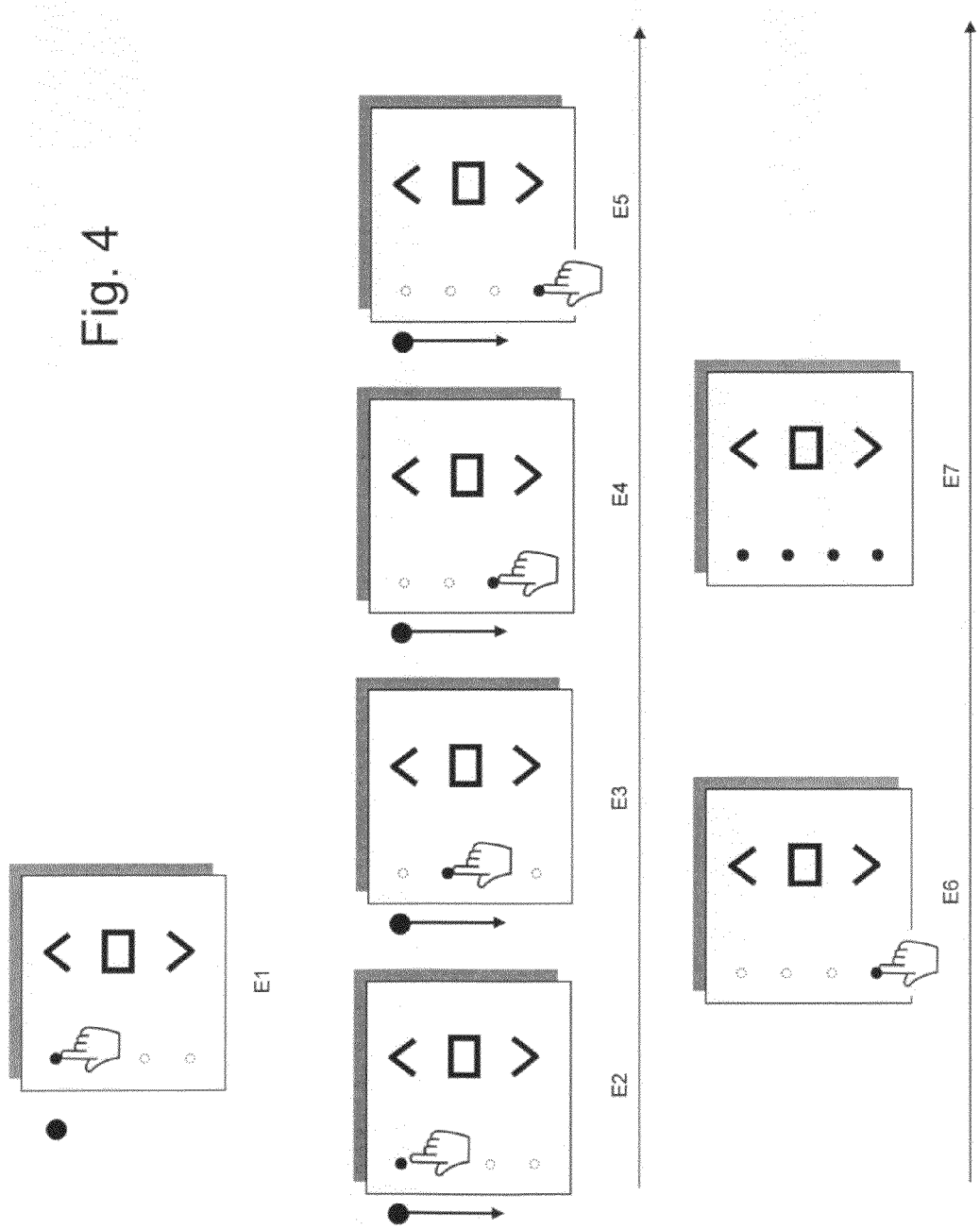

METHOD FOR SELECTING AN ITEM OF EQUIPMENT AND CONTROL UNIT ENABLING THIS METHOD TO BE IMPLEMENTED

BACKGROUND OF THE INVENTION

1. Field of the Invention

The invention relates to the field of control switches intended for the control of home automation apparatuses and in particular for the control of the functions offered by these switches. Such switches enable a user to select a command to be sent to one or more electrical apparatuses. They include an interface, known as a man-machine interface, through which the commands required by a user are translated into a control instruction intended for the apparatuses. These control instructions are, in particular, sent by wired means, for example by bus, cable, powerline communication etc., or by non-wired means, for example by radio, infrared etc.

2. Description of the Related Art

Regardless of the method of transmission, it is common for such switches to offer a large number of functions despite a limited number of keys. The Telis 4 remote control, sold by the applicant and intended to control motorised roller shutters or sun awnings, thus offers, in addition to the functions associated with the control buttons for raising, lowering (or opening-closing) and stopping, a common button for selection of a control channel, combined with the use of 4 light-emitting diodes. The instructions sent from a Telis 4 remote control are sent by radio to an apparatus or a group of apparatuses selected by activating a radio channel. Thus, a first apparatus may be controlled separately via channel 1, a second apparatus via channel 2, a third apparatus via channel 3 and a fourth apparatus via channel 4. A fifth channel is available after channel 4, channel 5 enabling the four apparatuses to be controlled as a group.

The configuration of the association between a channel and one or more apparatuses is usually carried out by an installer. During use, however, the user selects the chosen channel by one or more depressions of the common selection button, then gives the instruction via one of the control buttons. Channel 1 is the channel selected by default. The other channels are selected cyclically by further depressions of the selection button. Four light-emitting diodes (LEDs) enable the user to see which of channels 1 to 4 is the active channel. Each of these channels is indicated by the illumination of the corresponding diode. The fifth channel is indicated by the simultaneous illumination of the four diodes LED1, LED2, LED3, LED4 relating to the first four channels. Although this user-friendliness may be satisfactory, it requires multiple depressions and may sometimes require the user to repeat the depression cycle almost completely simply to change channel. Furthermore, it also becomes irksome when the number of channels increases.

Patent application DE-A-101 10 759 discloses the use of capacitive sensors to produce a multiple switch which can be used to control several items of electrical equipment. Each item of equipment is controlled by activation of the capacitive sensor dedicated to it.

Patent application FR 2 811 162 describes a device which enables the transmission of a control signal characteristic of a zone which has been touched lightly or a succession of signals specifying the meaning of the light touching in order to distinguish an instruction concerning upward movement from an instruction concerning downward movement.

In addition, patent application US-A-2006/0256089 describes a user device based on capacitive technology. This technology is currently used in control panels for domestic electrical appliances, for the screens of portable music players, and on screens for a medical apparatus. It allows the position or the movements in translation of a finger to be located on the screen surface. These actions are then translated by a microcontroller into output signals to the items of electrical apparatus.

In particular, this document aims to reduce the number of sensors, but without reducing the number of possible output signals. The control panel therefore provides a set of sensors distributed over the panel and detection means which operate as follows: where a single sensor in a pair of adjacent sensors is activated, a first output signal is produced whereas if both sensors in a pair of sensors are activated, a second output signal is produced, this second signal corresponding to a second output state. This document specifies that the activation of the sensors may include a sliding action over the surface of the panel. However, the activation of adjacent sensors may be the result of an involuntary movement by the user, this occurrence being more frequent when the number of sensors increases relative to the surface area of the panel. Thus, it seems that involuntary selections may be made.

SUMMARY OF THE INVENTION

The invention aims to remedy the problems described above. In particular, the invention aims to use the properties of capacitive technology which have been described above, but in such a way as to offer functions whose activation is reliable and assured.

To that end, the invention relates to a method for selecting a group of home automation equipment to be controlled from among several predefined groups of equipment, via sensitive zones of a control unit, each of these sensitive zones corresponding to a capacitive sensor and being disposed next to one another on the control unit, the method of selection being such that:

a predefined group of equipment associated with a given sensitive zone is selected by activating the capacitive sensor which corresponds to that sensitive zone; and at least one additional group of equipment, different from the equipment corresponding to each sensitive zone, is selected via a predetermined sequence for activating several capacitive sensors, of which at least two capacitive sensors correspond to two non-adjacent sensitive zones.

By virtue of the invention, a relatively high number of groups of equipment can easily be controlled, whilst using a simple, inexpensive control unit which occupies little space. According to the invention, a group of equipment can consist of just one item of equipment, for example a patio awning.

The activation of sensors corresponding to two non-adjacent sensitive zones during a predefined sequence, in order to cause a given group of equipment to be selected, enables the user's intention to be clearly distinguished and prevents unintentional activations, particularly where the activation areas concerned are small.

According to some advantageous but not obligatory aspects of the invention, such a method may incorporate one or more of the following features taken in any technically permissible combination:

A microcontroller receives an input signal produced by each capacitive sensor when it is activated, while this microcontroller generates a first output signal corresponding to the selection of a group of items of equipment associated with a sensitive zone in accordance with the input signal produced by a capacitive sensor corresponding to that sensitive zone and while, as a result of the use of the predetermined sequence of activation of the capacitive sensors, the microcontroller generates a second output signal different from first signal. The second signal generated when the complete activation sequence has been performed can be used for different purposes. It may provide the user with an additional signal, enabling him to control more items of equipment separately or simultaneously. In particular, where the second signal generated enables all the equipment to be controlled, it may also make it easy to select which items of equipment are to be controlled.

During a predetermined sequence of successive activations of capacitive sensors, the microcontroller records the input signals produced by the capacitive sensors, compares the recorded signals with signals stored in memory which correspond to the predetermined sequence of activations, and generates the second signal according to the result of that comparison.

The predetermined sequence of activations includes the successive activation of at least three capacitive sensors. Where at least three capacitive sensors must be activated, this increases the certainty that the combination of depressions is not accidental.

The predetermined sequence of activations includes a final stage in which a capacitive sensor is activated for a period greater than a predetermined value. During the sequence of depressions, the control of the activation of at least one of the sensors for a period above a predetermined threshold value prevents reactions as a result of rapid light touches on the surface of the panel. In particular, if the control interface is that of a mobile remote control, the latter is handled regularly and its surface may easily be touched unintentionally. The introduction of a minimum activation time for the last sensor in the sequence also makes it possible to confirm the user's intention. This activation also corresponds to a prolonged depression, in other words, the finger remains on the last sensor at the end of the sequence. Thus, this activation is both very intuitive and yet is particularly simple to perform. It makes it possible to confirm a sequence which has been used.

The predetermined sequence of activations is such that the length of the time-lag between two successive activations of capacitive sensors is less than a predetermined value.

The predetermined sequence of activations is performed by a user sliding his/her finger along a screen of the control unit, opposite the capacitive sensors to be activated. The activation sequence can be performed by sliding the finger over the different sensors. The introduction of a maximum activation time for each sensor during this sequence makes it possible to clearly distinguish this movement from an individual activation of a sensor.

Each activation of a capacitive sensor or the use of the predetermined sequence of activations causes a visual and/or audible feedback signal to be produced for the user. In particular, a visual and/or audible signal specifically marks the performance of a particular sequence, so that the user can be fully aware of the operation which he has initiated. This feedback signal may be produced very easily using a light-emitting diode which indicates very simply by its illuminated or off state whether or not the sensor has been activated. Advantageously, this same means can be used for feedback concerning the performance of the activation sequence. Thus, no other means of feedback is necessary, the existing means can be reused and combined.

The first output signals correspond to the individual selection of the group of equipment associated with a sensitive zone, whereas the second output signal corresponds to the individual selection of the additional group of equipment.

The additional group consists of the union set of the groups of equipment corresponding to the sensors activated during the predetermined sequence of activations.

Where a predetermined sequence of activations has been performed, the individual activation of a capacitive sensor causes the corresponding group of equipment to be excluded from the additional group or introduced into this group, depending on whether or not it was already part of this group.

The method may be used to create an ad-hoc group very easily, by selecting all the equipment in the additional group, then eliminating one or more unwanted groups of equipment.

The method is advantageously used as part of a control interface, in particular for a wall-mounted switch for the control of home automation items of equipment. Thus, the user has a switch with technological features but which is particularly easy to use and provides the sensory impression which the user requires.

The invention also relates to a unit enabling the above-mentioned method to be implemented and, more specifically, a control unit of an installation including several predefined groups of home automation equipments, this unit including at least one sensitive zone for selection of a group of equipment wherein the control unit includes several selection zones disposed next to one another, in that each selection zone is associated with a capacitive sensor and in that a microcontroller forming part of the control unit is able to process input signals produced by the capacitive sensors and to send output signals whose number is strictly greater than the number of selection zones and which depend on the signals produced by the capacitive sensors.

Advantageously but not obligatorily, such a unit may incorporate one or more of the following features, taken in any technically permissible combination:

A light-emitting diode is associated with each capacitive sensor within a sensitive selection zone, the diode being capable of illumination when the sensor is activated.

The unit includes a screen covering at least the capacitive sensors and the associated diodes, the screen being translucent or transparent, at the frequency of the light emitted by the diodes, at least in the part of it covering the diodes, while the screen is provided, opposite each capacitive sensor, with an area in relief enabling the different sensitive selection zones to be located by touch. For example, the fact that each sensor can be located by a slight additional thickness on a smooth surface makes it possible to clearly distinguish the depressions of a button but without preventing a finger from sliding over the surface.

The unit includes, in addition to the sensitive selection zones, means for controlling a selected group of equipment.

BRIEF DESCRIPTION OF THE DRAWINGS

The invention will be better understood and its other advantages will become more apparent in the light of the following description of an installation incorporating a control unit according to the invention and selection methods according to its principle, given solely as an example and with reference to the appended drawings in which:

FIG. 4 is a diagram explaining the implementation of a selection method according to the invention.

DESCRIPTION OF THE PREFERRED EMBODIMENTS

Figure 1:
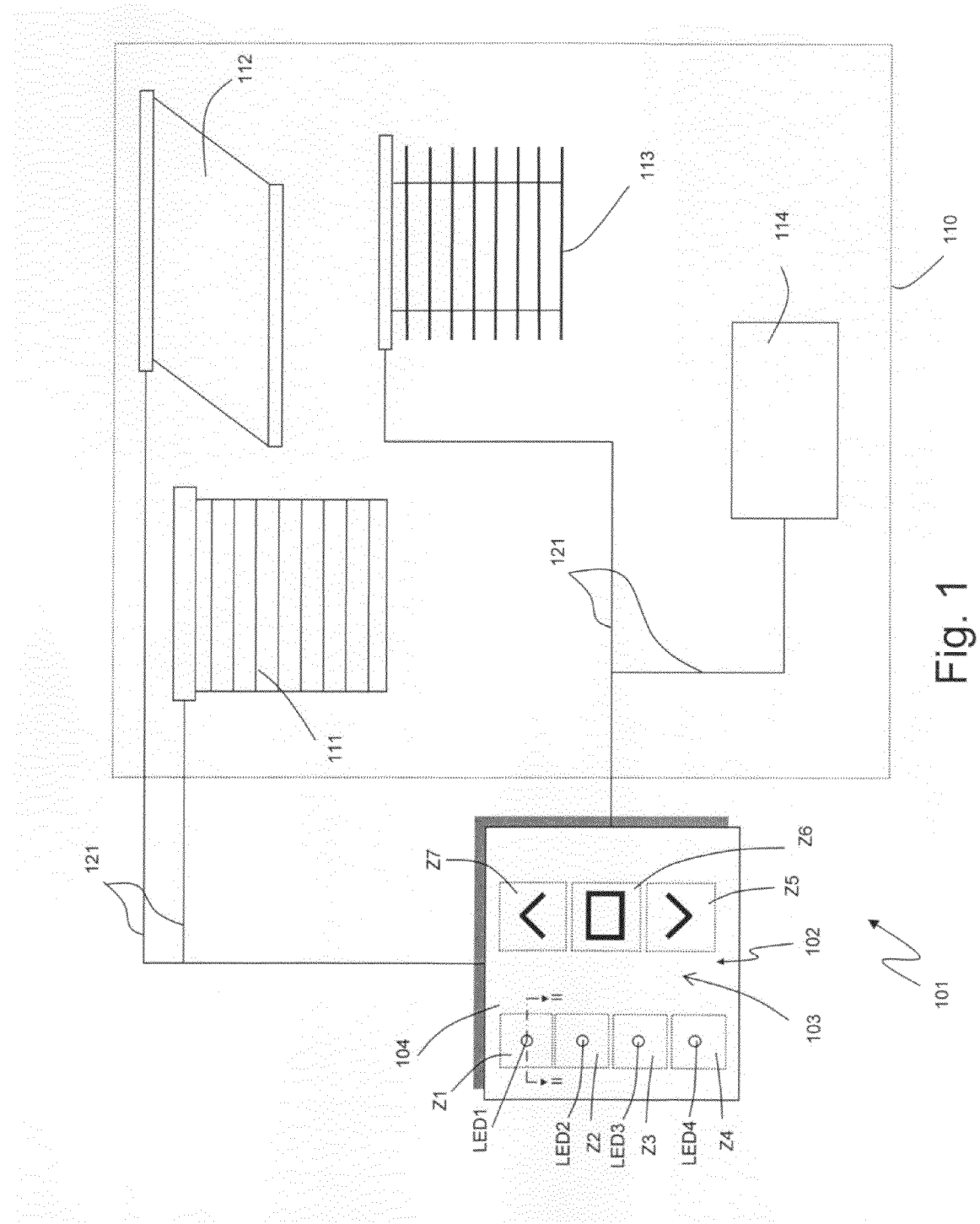
FIG. 1 is a schematic representation in principle of a home automation installation incorporating a unit according to the invention.

FIG. 1 shows a home automation installation 101 including firstly a wall-mounted control point 102 intended for controlling domestic electromechanical or electrical apparatuses. To do this, the control point 102 is connected by cables 121 to these apparatuses. According to a variant of the invention which is not illustrated, the control point 102 is connected to the apparatuses by non-wired means, for example by radio.

The set of apparatuses is numbered 110. It includes, in particular, a motorised roller shutter 111, a motorised patio awning 112, a motorised Venetian blind 113 and another apparatus 114 which can be of the same type as the previous apparatuses or of another type, including a heating apparatus, an air-conditioning apparatus, a lamp, etc. Each element of the installation 101 includes means (not shown) for it to be supplied with power, either using its own means or by connection to a network.

The control point 102 is formed by a capacitive panel provided with a man-machine interface 103, this interface including, on a screen 104, a plurality of sensitive activation zones Z1-Z7 of a capacitive type, equivalent to keys, and represented in FIG. 1 by squares outlined by dots. These sensitive zones form sensitive keys and are each associated with a capacitive sensor C1 to C7 respectively and some of these zones known as selection zones, namely zones Z1 to Z4, are each also associated with a light-emitting diode LED1 to LED4 respectively. The screen 104 forms a cover below which are placed, on a printed circuit 105, the sensors C1-C7, the diodes LED1 to LED4 and a microcontroller 106 capable of analysing input signals S1 to S7 produced by the sensors C1 to C7 when they are activated and of producing output signals S'1 to S'N according to the signals produced by these sensors, where N is an integer strictly greater than 4, that is, the number of selection zones.

In each part disposed opposite a diode LED1 to LED4, the screen 104 is transparent, or at least translucent, which enables a user to see the illumination of a diode through the screen 104.

According to the present invention, a sensor C1-C7 is activated when, because of the change in its capacity as a result of pressure by or the passage close to this sensor of one of the user's fingers, the physical properties of this sensor are altered beyond a certain threshold. Once activated, the sensor sends an input signal S1, S2, S3 or S4 to the microcontroller 106.

The selection zones Z1 to Z4 associated with the diodes LED1 to LED4 enable the channel for the transmission of data to be selected, whilst the other zones Z5 to Z7 are control keys for an apparatus in the set 110. Thus, the zone Z5 controls the closure of apparatuses 111 to 113 or the reduction in luminous intensity of a lamp forming apparatus 114, while the key Z7 controls the opening or the increase in luminous intensity of these apparatuses and zone Z6 is a zone controlling the stopping or interruption of operation. In the case of a lighting apparatus, the key Z6 can be used to move alternately from an illuminated state to an off state.

The control point 102 is capable of sending signals on several channels. According to the present invention, a channel corresponds to the logical selection of an item of equipment or a group of items of equipment in the set 110, this selection being effected, in practice, by a specific address incorporated into an electromagnetic signal sent via the cables 121 or by radio waves on a carrier frequency common to all the equipments. Alternatively, a channel may be specified via a carrier frequency particular to this channel.

Each channel enables control instructions to be sent to one or more selected apparatuses depending on the configuration of the home automation installation. Channel 1 may thus control the roller shutter 111, while channel 2 controls the patio awning 112, channel 3 controls the internal blinds 113 and channel 4 controls the main lamp 114 in the room in which the control point 102 is installed.

A protective plate 107 is placed between the printed circuit 105 and the cover 104, in such a way as to conceal the electronic components, but without disrupting the operation of the capacitive sensors C1 to C7. In this example, the activation zone of each sensor C1 to C4 is centred around a diode and the cover 104 includes on its upper surface a sensory zone ZS shown here by a slight additional thickness 108 detectable to the touch. Alternatively, this sensory zone ZS could consist of a hollow or any other area in relief enabling it to be detected by touch.

The additional thickness 108 may also serve as a magnifier enabling better transmission of the light from a diode through the screen 104 which is transparent or translucent, at least in this zone.

Figure 2:
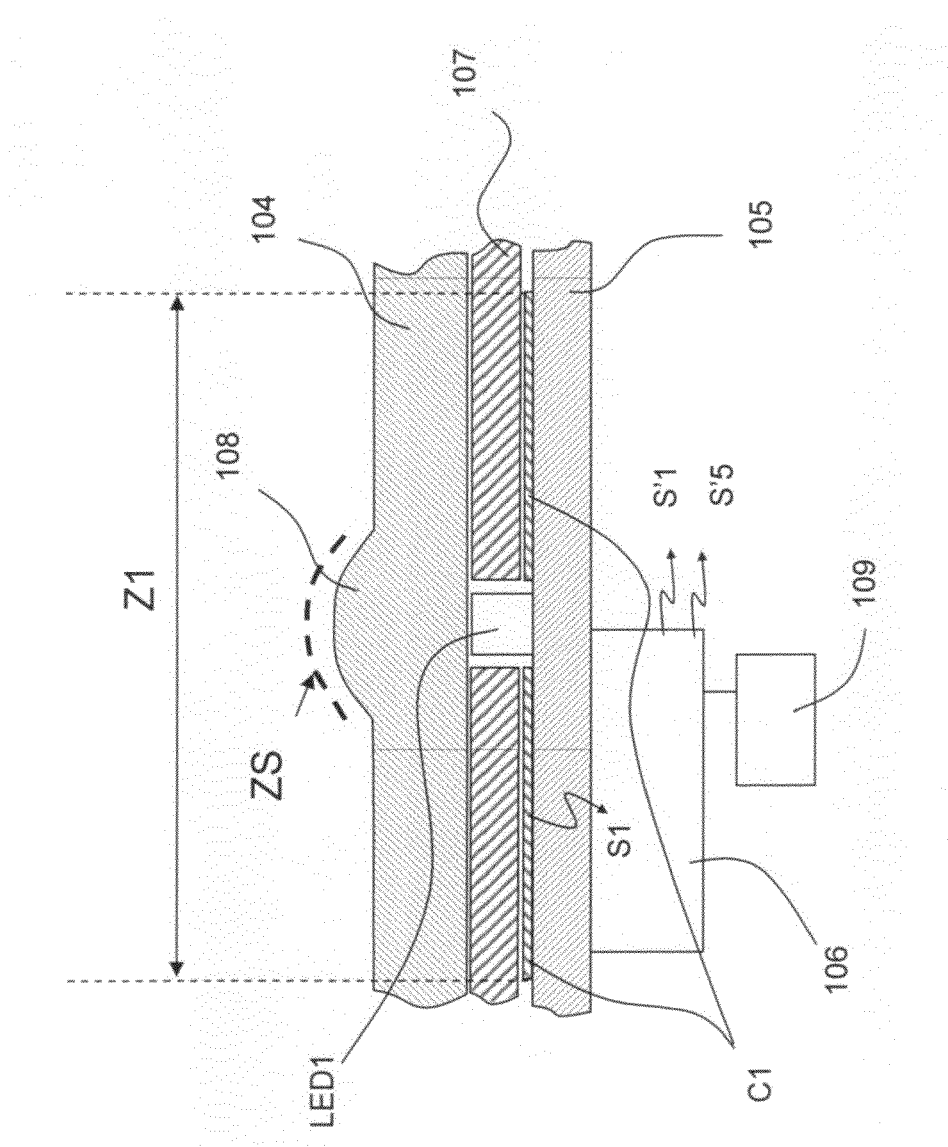
FIG. 2 is a partial cross-section along the line II-II in FIG. 1.
Figure 3:
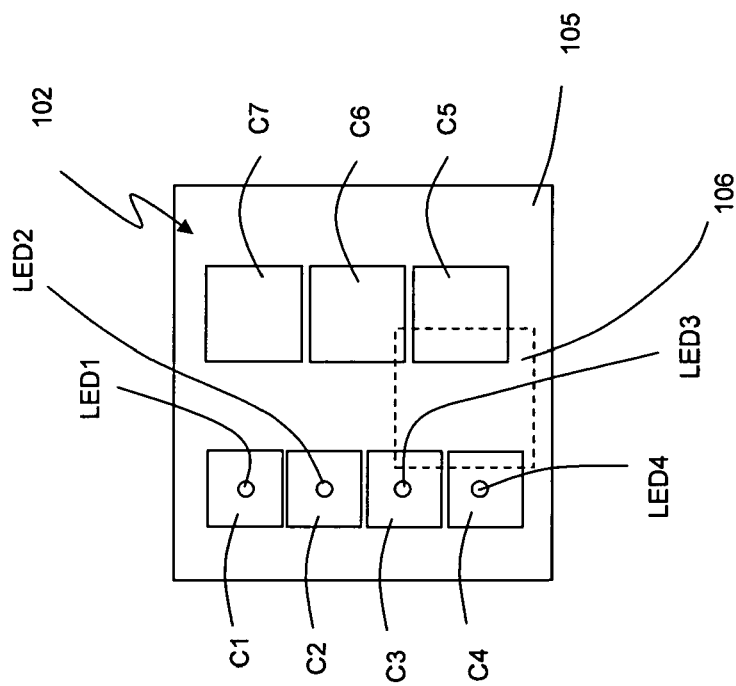
FIG. 3 is a frontal view of the control unit of the installation in FIG. 1, whose screen and protective plate have been omitted from the drawing, for the sake of clarity

Taking FIG. 2 as an example, when the sensor C1 is activated, it sends the microcontroller 106 an input signal S1 indicating its state of activation. This state of activation corresponds to the selection of the roller shutter 111 by the user. Thus, when one of zones Z5 to Z7 is activated after selection of the roller shutter 111, an output signal S'1 is incorporated into the control instruction sent to the set of apparatuses 110 by the control point 102. Likewise, when one of the sensors C2 to C4 is activated, it sends the microcontroller 106 a corresponding input signal S2 to S4 and the latter incorporates corresponding output signals S'2 to S'4 into the control signals intended for the apparatuses in the set 110.

The input signal S1, S2, S3, S4 produced by an activated sensor C1 to C4 or the corresponding output signal S'1 to S'4, sent by the microcontroller 106 in response to the input signal S1, S2, S3 or S4, also causes illumination of the diode LED1 to LED4 corresponding to the activated sensor. It also turns off the diodes corresponding to the non-activated sensors. The user perceives this illumination of the diode as a feedback signal confirming to him that the sensor concerned is indeed activated.

As a variant or additionally, the feedback signal may be audible.

According to a first embodiment, the invention allows the selection of an additional separate channel, relative to channels 1 to 4, using the activation zones Z1 to Z4.

Different examples show that it is possible to select other additional separate channels, on the basis of different sequences of activation of the four sensors associated with zones Z1 to Z4. These examples are set out in the table below, in the form of a non-exhaustive list:

| Channel number. | Sequence |
| --- | --- |
| 1 | Z1 |
| 2 | Z2 |
| 3 | Z3 |
| 4 | Z4 |
| 5 | Z1-Z2-Z3-Z4 |
| 6 | Z4-Z3-Z2-Z1 |
| 7 | Z1-Z2-Z3 |
| 8 | Z2-Z3-Z4 |
| 9 | Z3-Z2-Z1 |
| 10 | Z4-Z3-Z2 |

In this example, the number N mentioned above is equal to 10. In this table, channels 5 to 10 represent configurations obtained by a simple sliding movement of the finger.

Some of these examples are more intuitive than others. The example of the selection of the channel numbered 5 is described with reference to FIG. 4.

During a stage E1, when only one of the sensors C1 to C4 is activated, for example the sensor corresponding to channel 1, the corresponding diode LED 1 illuminates and a control instruction issued at that moment, by pressing on one of zones Z5 to Z7, is sent to the apparatus or apparatuses associated with channel 1, the roller shutter 111 in the example mentioned above. The configuration shown at stage E1 may also correspond to a default situation. However, in order to save energy, the diodes, and in particular the first diode LED1, do not normally remain illuminated permanently. The first diode LED1 may illuminate again during a subsequent command, there being no need to activate the zone corresponding to the sensor C1 again if the latter is associated with the channel by default.

During this stage E1, when the user places his finger on zone Z1, he activates the corresponding sensor C1 and the latter sends the microcontroller 106 an input signal S1 which enables the microcontroller to send an output signal S'1 corresponding to the selection of the first channel, and thus of the first group of apparatuses, namely the shutter 111. Thus, the group containing the roller shutter 111 is selected by activating the sensor C1.

This approach used in stage E1 is used each time that the user wishes to control one of the apparatuses 111 to 114, on one of the channels 1 to 4, the microcontroller 106 then sending an output signal S'1 to S'4 depending on the apparatus or apparatuses selected.

The procedure for sending a signal on channel 5 will now be described.

During a stage E2, the user places his finger on zone Z1 corresponding to the sensor C1. The diode LED1 illuminates. During a stage E3, the user places his finger on zone Z2 corresponding to the sensor C2. The first diode LED1 then goes out and the second diode LED2 illuminates.

Similarly, when the user afterwards moves his finger relatively rapidly, that is, in less than 200 ms, towards zone Z3 of the sensor C3 at stage E4, the second diode LED2 then goes out and the third diode LED3 illuminates. Then, when the user moves his finger relatively rapidly at stage E5 towards the zone Z4 of the sensor C4, the third diode LED3 then goes out and the fourth diode LED4 illuminates.

During a subsequent stage E6, the user holds his finger over zone Z4 corresponding to the sensor C4 during a period of time whose duration is greater than a predetermined value $\Delta t_1$, for example equal to 1 second, but preferably equal to 500 ms.

As a variant, the stage E6 described above may be replaced by another confirmation mechanism, such as a rapid depression of the last key touched.

To validate the predetermined activation sequence Z1-Z2-Z3-Z4 of the sensors C1-C4, the microcontroller 106 verifies that the time lag between two successive activations of the sensors, that is, between two of the stages E2 to E5, is below a predetermined threshold value $\Delta t_2$, for example equal to 200 ms.

The microcontroller verifies in addition or alternatively that all the stages E2 to E6 take place within a predefined period of time $\Delta T$, $\Delta T$ being for example equal to 2 seconds.

If the microcontroller establishes that the time lag between two stages E2 to E5 is less than $\Delta t_2$, and/or that the total duration of stages E2 to E6 is less than $\Delta T$ and that the activation of the sensor C4 at stage E6 is maintained for a sufficient duration, greater than $\Delta t_1$, the conditions for performing the predetermined sequence of activation of the sensors C1 to C4 corresponding to channel 5 are deemed by the microcontroller 106 to have been fulfilled. All the diodes LED1-LED4 then illuminate during a subsequent stage E7. This is because the microcontroller 106 decides that it has received, within the conditions of time and order, the different input signals sent by the sensors C1-C4 in accordance with a predefined sequence and it then generates a second output signal S'5 which firstly allows the simultaneous illumination of the different diodes LED1 to LED4 and, secondly, the selection of the apparatuses corresponding to channel 5. The instructions sent using the sensors C5-C7 thus concern the apparatuses designated for channel 5, for example, all the apparatuses connected to the control point 102.

The simultaneous illumination of the diodes LED1 to LED4 at stage E7 constitutes a feedback signal for the user which enables him to be certain that the predetermined sequence of activation of the sensors C1 to C4 which he has just performed has actually enabled him to send on channel 5.

Where the user performs the predetermined sequence Z1-Z2-Z3-Z4 of activation of the sensors C1 to C4, the microcontroller 106 records the input signals S1 to S4 sent successively by the sensors C1 to C4 and the delays between these signals and compares them with the data concerning signals stored in a memory 109 fitted to the circuit 105. The microcontroller 106 is thus capable of comparing the series of input signals which it receives from the sensors C1 to C4 with a predetermined sequence corresponding to the values stored in the memory 109. If the series of signals actually corresponds with this sequence, the microcontroller 106 generates a second signal S'5. Otherwise, the microcontroller does not generate the signal S'5.

The second signal S'5 is generated only when the activation sequence Z1-Z2-Z3-Z4 is complete, which again prevents involuntary activations.

The additional group of equipment corresponding to the second signal S'5 may consist of items of equipment totally different from those corresponding to the first four groups of equipment. Conversely, the additional group can consist of the union set of several groups of equipment, or even all four groups of equipment.

In this example, during the individual activation of a sensor C1 to C4, the signal previously generated is cancelled. This is because when the finger slides from a first activation zone, for example Z1, towards a new activation zone, for example Z2, the first diode LED1 goes out and the second diode LED2 corresponding to the second activation zone illuminates. Thus, if an activation sequence Z1-Z2-Z3-Z4 is interrupted whilst being performed, or if it is not confirmed by prolonged activation of the last sensor at stage E6, the last single channel activated remains active.

Insofar as each individual activation cancels the previous activation, the activation sequence can be interrupted whilst being performed without this having repercussions. The last of the signals generated is the signal taken into consideration, the user does not have to repeat the activation.

According to a second embodiment, the invention allows the production of a second signal whose effect is to modify the management by the microcontroller of the signals sent by the sensors.

In a preferred embodiment, the additional group of equipment consists of the union set of all the groups of equipment. Once this additional group has been selected by the activation sequence Z1-Z2-Z3-Z4, a new activation of a sensor C1 to C4 causes, in this case, not a new first signal but the exclusion of the activated sensor from the additional group or its inclusion in the group if it is not or is no longer part of it. It is therefore possible to simultaneously and selectively select several zones Z1 to Z4 without necessarily applying pressure to these zones simultaneously. This particular mode of operation remains valid for a predetermined period after the activation sequence has been performed. In this way, an ad hoc additional group is easily created.

According to a third embodiment dependent on the first two, the invention enables the generation of a signal providing preliminary feedback to the user.

This third embodiment is based on dynamic analysis of the information provided by the sensors C1 to C4.

When a user brings his finger close to the capacitive panel 102, it is possible to detect this effect via a variation in the signal produced by one or more of the sensors C1 to C4. In a variant, this proximity detection can be effected via another sensor which is not necessarily capacitive but, for example, infrared. In any case, this makes it possible to detect the approach of the user's finger before one or more of the sensors C1 to C4 is actually activated.

When one or more of the sensors C1 to C4 sends a low-intensity activation signal, the microcontroller 106 infers from it the proximity of the user's finger and generates a proximity signal. This proximity signal produces illumination of the diodes in an initial colour or at a lower intensity than normal illumination. The illumination may affect all the available diodes or only those corresponding to the sensors which sent an initial low-intensity signal to the microcontroller. Alternatively, the illumination may affect the active channel by default. The user is thus given initial visual information before activating the selected sensor.

In order to implement the predetermined sequence of activations Z1-Z2-Z3-Z4 on a wall-mounted switch comprising a capacitive panel 102, the user brings his finger close to and places it on the first zone Z1 and the diode corresponding to the first sensor C1 then illuminates first of all in its initial colour, or at a low intensity, then in a second colour, or at its normal intensity. As the other zones Z2 to Z4 are lightly covered by the finger, the corresponding sensors therefore detect once again the proximity of a finger, in particular the adjacent zone Z2. The corresponding diode or diodes illuminate in their first colour or at a low intensity. When the user slides his finger along the capacitive panel 102 along the activation zones Z1-Z4, the diodes for the zones close to the finger illuminate in sequence according to their normal illumination, whilst the first diodes go out completely, illuminate at a lower intensity or in an initial colour. The change in the illumination of the diodes gives a visual impression of showing the path to be followed by the finger.

The man-machine interface shown 103 may include capacitive sensors C1 to C4 for selection of the control channel and mechanical keys, instead of the sensors C5 to C7, for the control keys, without going beyond the scope of the invention.

The use of the capacitive sensors C1 to C4 combined with the diodes LED 1 to LED4 enables the sensory perception of the user to be increased, as does the use of slight additional thicknesses on the sensor zones. These additional thicknesses do not in any way hinder a finger from sliding over the screen 104, but form sensory zones ZS which enable a user to clearly perceive the performance of an activation sequence. Capacitive technology is often criticised for its lack of sensory feedback. The invention thus makes it possible to solve this often-mentioned problem, by introducing sensory information, whether this involves a single activation or a more complex, but intuitive, activation of a set of sensors.

As a variant, the light-emitting diodes are offset relative to the sensor zones.

The invention also makes possible the simultaneous activation of two sensors C1 to C4 in order to generate a third signal, which can also be used to increase the number of groups or to form part of special programming sequences.

The invention is explained above with reference to the case where a second output signal S'5 sent by the microcontroller 106 corresponds to channel 5. Likewise, according to its programming, signals S'6 to S'10 can be sent by the microcontroller 106, corresponding to channels 6 to 10 of the above table.

The invention claimed is:

1. A method for selecting at least one piece of equipment to be electronically controlled from a first predefined group of home automation equipment and at least one additional predefined group of home automation equipment, by way of activation of a first number of capacitive sensors that belong to a set of capacitive sensors that are disposed next to one another on a control unit, and wherein the capacitive sensors are electronically connected by wire or wireless signals to the equipment of the first predefined group and to the equipment in the at least one additional predefined group, the method of selection including the steps of:
   A. selecting at least one piece of equipment from the first predefined group of equipment by activating only an individual one of the first number of capacitive sensors which is electronically connected to the at least one piece of equipment of the first predefined group; and
   B. selecting at least one piece of equipment from the at least one additional predefined group of equipment by activating a plurality of the first number of capacitive sensors in different predetermined sequences and wherein at least two of the activated capacitive sensors of the first number are spaced from one another by at least one intermediate capacitive sensor of the first number.

2. The method according to claim 1 wherein a microcontroller receives an input signal produced by each capacitive sensor of the first number when each capacitive sensor is individually activated, the microcontroller generating a first output signal corresponding to the selection of at least one piece of equipment associated with the individually activated first number of capacitive sensors, and as a result of the use of the predetermined sequence of activation of the first number of capacitive sensors, the microcontroller generates a second output signal different from the first signal.

3. The method according to claim 2 wherein, during a predetermined sequence of successive activations of the first number of capacitive sensors, the microcontroller records input signals produced by the activated first number of capacitive sensors, compares the recorded signals with signals stored in memory which correspond to the predetermined sequence of activations, and generates the second signal according to the result of the comparison.

4. The method according to claim 1 wherein the predetermined sequence of activations includes a successive activation of at least three of the first number of capacitive sensors.

5. The method according to claim 1 wherein the predetermined sequence of activations includes a final stage in which one of the first number of capacitive sensors is activated for a period greater than a predetermined time.

6. The method according to claim 1 wherein the predetermined sequence of activations is such that a length of a time-lag between two successive activations of the first number of capacitive sensors is less than a predetermined value.

7. The method according to claim 1 wherein the predetermined sequence of activations is performed by a user sliding his/her finger along a screen of the control unit, over the first number of capacitive sensors.

8. The method according to claim 1 wherein each activation of a first one of the capacitive sensors or the predetermined sequence of activations of the first number of the capacitive sensors causes a visual and/or audible feedback signal to be produced for the user.

9. The method according to claim 1 wherein the additional group consists of a set of the predefined groups of equipment corresponding to the sensors activated during the predetermined sequence of activations of the first number of capacitive sensors.

10. The method according to claim 1 wherein where a predetermined sequence of activations has been performed, the individual activation of one of the first number of capacitive sensor causes the corresponding equipment controlled by such first number of capacitive sensors to be excluded from the additional group or introduced into this group, depending on whether or not it was already part of this group.

11. The method of claim 1 including the additional step of activating at least one capacitive sensor from the set of capacitive sensors which is separate from the first number of sensors to actively control equipment which has been selected.

12. A control unit of an installation including at least one first predefined group of home automation equipment and at least one additional predefined additional group of home automation equipment, the unit including a first number of at least three capacitive sensors disposed next to one another which upon being individually activated select at least one piece of equipment of the first predefined group, and wherein when a sequence of the first number of at least three capacitive sensors are activated at least one piece of equipment of the additional predefined group is selected, and wherein a microcontroller forming part of the control unit processes input signals produced by the first number of at least three capacitive sensors and sends output signals whose number is greater than a number of the first number of at least three capacitive sensors and depends on signals produced by the first number of at least three capacitive sensors.

13. The control unit according to claim 12 wherein a light-emitting diode is associated with each of the at least three capacitive sensors, each diode being illuminated when a corresponding one of the at least three sensors is activated.

14. The control unit according to claim 13 including a screen covering at least the at least three capacitive sensors and the associated diodes, the screen being translucent or transparent at the frequency of light emitted by the diodes, and wherein the screen is provided, opposite each of the at least three capacitive sensors, with an area in relief enabling the different capacitive sensors to be located by touch.

15. The control unit according to claim 12 including means for controlling equipment electronically connected by activation of the at least three capacitive sensors.

16. The control unit according to claim 12 including at least one additional capacitive sensor which is separate from the first number of sensors an which is activated to control equipment which has been selected by activation of at least one of the capacitive sensors of the first number.

* * * * *